(12) United States Patent
Liu et al.

(10) Patent No.: US 11,705,921 B2
(45) Date of Patent: Jul. 18, 2023

(54) ADAPTIVE SWITCH BIASING SCHEME FOR DIGITAL-TO-ANALOG CONVERTER (DAC) PERFORMANCE ENHANCEMENT

(71) Applicant: QUALCOMM Incorporated, San Diego, CA (US)

(72) Inventors: Xilin Liu, San Diego, CA (US); Nitz Saputra, Burlingame, CA (US); Behnam Sedighi, La Jolla, CA (US); Ashok Swaminathan, Cardiff, CA (US); Dongwon Seo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 215 days.

(21) Appl. No.: 17/337,619

(22) Filed: Jun. 3, 2021

(65) Prior Publication Data

US 2021/0391871 A1 Dec. 16, 2021

Related U.S. Application Data

(60) Provisional application No. 63/037,060, filed on Jun. 10, 2020.

(51) Int. Cl.
| | |
|---|---|
| *H03M 1/66* | (2006.01) |
| *H03M 1/74* | (2006.01) |
| *H04B 1/04* | (2006.01) |
| *G05F 3/26* | (2006.01) |
| *H03M 1/00* | (2006.01) |
| *H03M 1/68* | (2006.01) |

(52) U.S. Cl.
CPC .............. *H03M 1/74* (2013.01); *G05F 3/262* (2013.01); *H04B 1/04* (2013.01); *H03M 1/002* (2013.01); *H03M 1/68* (2013.01)

(58) Field of Classification Search
CPC .......... H03M 1/74; H03M 1/002; H03M 1/68; G05F 3/262; H04B 1/04
See application file for complete search history.

(56) References Cited

U.S. PATENT DOCUMENTS 9,379,727 B1 6/2016 Seo et al.
10,833,687 B1 * 11/2020 Hamilton ................ H03M 3/32

\* cited by examiner

*Primary Examiner* — Joseph J Lauture
(74) *Attorney, Agent, or Firm* — Patterson + Sheridan LLP (57) ABSTRACT

Methods and apparatus for adaptively generating a reference voltage ($V_{REF}$) for biasing a switch driver and corresponding switch in a digital-to-analog converter (DAC). The adaptive biasing scheme may be capable of tracking process, voltage, and temperature (PVT) of the DAC. An example DAC generally includes a plurality of DAC cells, each DAC cell comprising a current source, a switch coupled in series with the current source, and a switch driver coupled to a control input of the switch, the switch driver being configured to receive power from a first power supply rail referenced to a reference potential node; a regulation circuit comprising a first transistor coupled between the reference potential node for the DAC and the switch driver in at least one of the plurality of DAC cells; and a $V_{REF}$ generation circuit coupled to the regulation circuit and configured to adaptively generate a $V_{REF}$ for the regulation circuit.

30 Claims, 7 Drawing Sheets

ADAPTIVE SWITCH BIASING SCHEME FOR DIGITAL-TO-ANALOG CONVERTER (DAC) PERFORMANCE ENHANCEMENT

CROSS-REFERENCE TO RELATED APPLICATION

This application claims the benefit of priority to U.S. Provisional Application No. 63/037,060, filed Jun. 10, 2020, which is expressly incorporated by reference herein in its entirety as if fully set forth below and for all applicable purposes.

TECHNICAL FIELD

Certain aspects of the present disclosure generally relate to electronic circuits and, more particularly, to techniques and apparatus for adaptively generating a reference voltage for biasing a switch driver and corresponding switch in a digital-to-analog converter (DAC).

BACKGROUND

Wireless communication devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, 5G New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., WiFi), and the like.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include a transmission digital-to-analog converter (TX DAC), which may be used, for example, to convert a digital signal to an analog signal for signal processing (e.g., filtering, upconverting, and amplifying) before transmission by one or more antennas.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include lower supply voltage and current, higher bandwidth, and a smaller area for a ground low dropout (LDO) regulator in a digital-to-analog converter (DAC).

Certain aspects of the present disclosure provide a DAC. The DAC generally includes a plurality of DAC cells, each DAC cell comprising a current source, a switch coupled in series with the current source, and a switch driver coupled to a control input of the switch, the switch driver being configured to receive power from a first power supply rail referenced to a first reference potential node; a regulation circuit comprising a first transistor coupled between the first reference potential node and the switch driver in at least one of the plurality of DAC cells; and a reference voltage generation circuit coupled to the regulation circuit and configured to adaptively generate a reference voltage for the regulation circuit.

Certain aspects of the present disclosure provide a DAC. The DAC generally includes a plurality of DAC cells, each DAC cell comprising a current source, a switch coupled in series with the current source, and a switch driver coupled to a control input of the switch, the switch driver being configured to receive power from a first power supply rail referenced to a reference potential node for the DAC; a regulation circuit comprising a first transistor coupled between the reference potential node for the DAC and a last stage of one or more of the switch drivers; and an adaptive reference voltage generation circuit coupled to the regulation circuit and configured to adaptively generate a reference voltage for the regulation circuit.

Certain aspects of the present disclosure provide a DAC. The DAC generally includes a plurality of DAC cells, each DAC cell comprising a current source, a switch coupled in series with the current source, and a switch driver coupled to a control input of the switch, the switch driver being configured to receive power from a first power supply rail referenced to a first reference potential node; a regulation circuit comprising a first transistor coupled between the first reference potential node and a last stage of one or more of the switch drivers; and an adaptive reference voltage generation circuit coupled to the regulation circuit and configured to adaptively generate a reference voltage for the regulation circuit.

Certain aspects of the present disclosure provide a wireless device. The wireless device includes the DAC as described herein, an antenna, and a transmit chain coupled between an output of the DAC and the antenna.

Certain aspects of the present disclosure provide a method of digital-to-analog conversion. The method generally includes operating a DAC comprising a plurality of DAC cells, each DAC cell comprising a current source, a switch coupled in series with the current source, and a switch driver having an output coupled to a control input of the switch; generating a reference voltage that tracks at least one of a process, supply voltage, or temperature of the switch in at least one of the plurality of DAC cells; and regulating a reference potential for the switch driver in the at least one of the plurality of DAC cells based on the reference voltage.

Certain aspects of the present disclosure provide a method of digital-to-analog conversion. The method generally includes operating a DAC comprising a plurality of DAC cells, each DAC cell comprising a current source, a switch coupled in series with the current source, and a switch driver having an output coupled to a control input of the switch; generating a reference voltage that tracks at least one of a process, supply voltage, or temperature of one or more of the switches; and regulating a reference potential for a last stage of one or more of the switch drivers based on the reference voltage.

Certain aspects of the present disclosure provide an apparatus for digital-to-analog conversion. The apparatus generally includes a plurality of DAC cells, each DAC cell comprising a current source, a switch coupled in series with the current source, and means for controlling the switch; means for generating a reference voltage that tracks at least one of a process, supply voltage, or temperature of one or more of the switches; and means for regulating a reference potential for the means for controlling based on the reference voltage.

Certain aspects of the present disclosure provide an apparatus for digital-to-analog conversion. The apparatus generally includes a plurality of DAC cells, each DAC cell comprising a current source, a switch coupled in series with the current source, and means for controlling the switch; means for generating a reference voltage that tracks at least one of a process, supply voltage, or temperature of the switch in at least one of the plurality of DAC cells; and means for regulating a reference potential for the means for controlling based on the reference voltage.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure relate to techniques and apparatus for adaptively biasing a switch driver and the corresponding switch in a digital-to-analog converter (DAC), such as a current switch in a current-steering DAC, and to techniques and apparatus for adaptively generating a reference voltage ($V_{REF}$) for the adaptive switch biasing.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
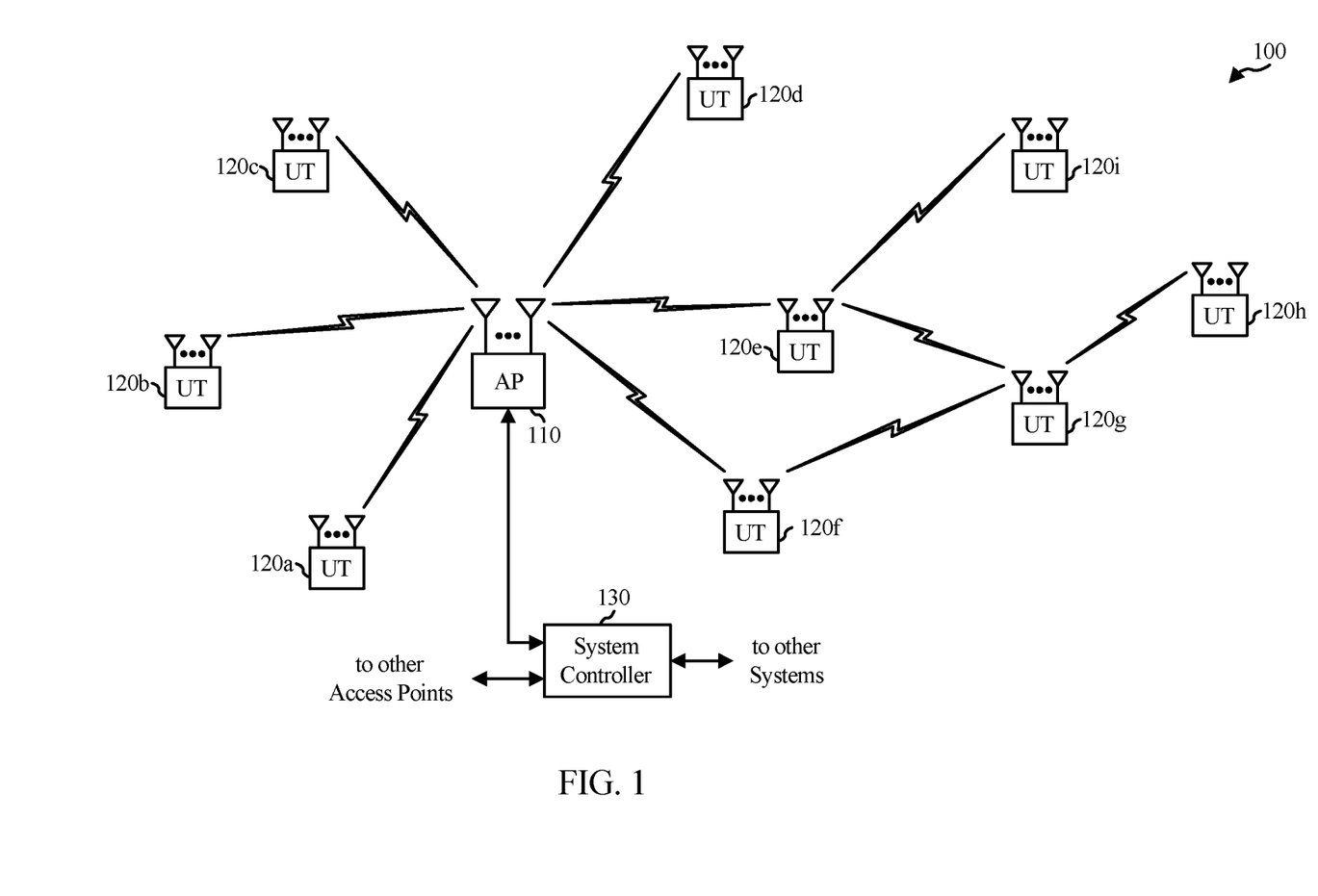
FIG. 1 is a diagram of an example wireless communications network, in which aspects of the present disclosure may be practiced.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNodeB or eNB), a next generation Node B (gNodeB or gNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 uses multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported).

In certain aspects of the present disclosure, the access point 110 and/or user terminal 120 may include a digital-to-analog converter (DAC) with adaptive switch biasing, as described in more detail herein.

Figure 2:
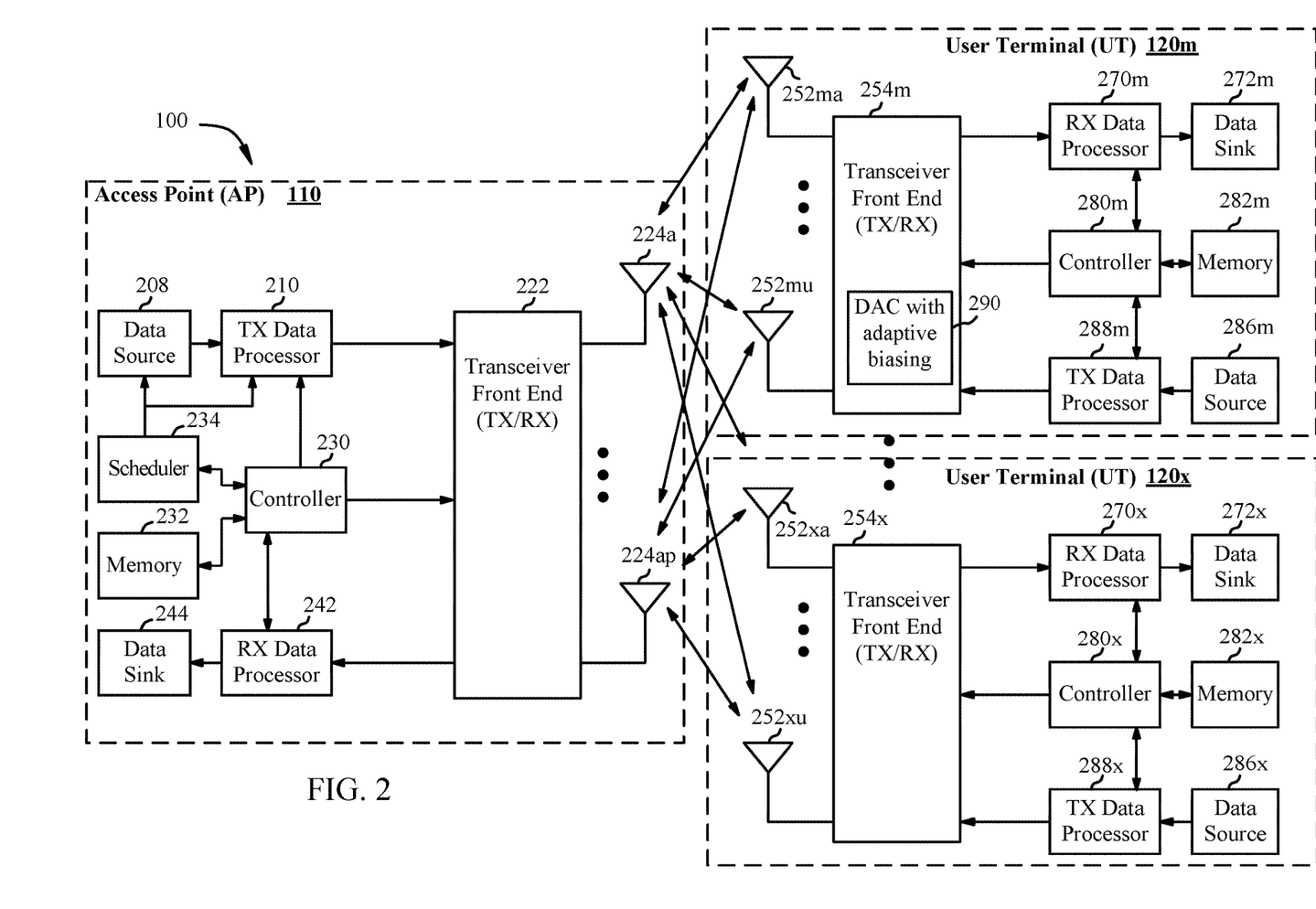
FIG. 2 is a block diagram of an example access point (AP) and example user terminals, in which aspects of the present disclosure may be practiced.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front-end (TX/RX) 254 (also known as a radio frequency front-end (RFFE)) receives and processes (e.g., converts to analog, amplifies, filters, and frequency upconverts) a respective symbol stream to generate an uplink signal. The transceiver front-end 254 may also route the uplink signal to one of the $N_{ut,m}$ antennas for transmit diversity via an RF switch, for example. The controller 280 may control the routing within the transceiver front-end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front-end 222 may select signals received from one of the antennas 224 for processing. The signals received from multiple antennas 224 may be combined for enhanced receive diversity. The access point's transceiver front-end 222 also performs processing complementary to that performed by the user terminal's transceiver front-end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

In certain aspects of the present disclosure, the transceiver front-end (TX/RX) 222 of access point 110 and/or transceiver front-end 254 of user terminal 120 may include a DAC 290 with adaptive switch biasing, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front-end 222 receives and processes (e.g., converts to analog, amplifies, filters, and frequency upconverts) the symbol stream to generate a downlink signal. The transceiver front-end 222 may also route the downlink signal to one or more of the $N_{ap}$ antennas 224 for transmit diversity via an RF switch, for example. The controller 230 may control the routing within the transceiver front-end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front-end 254 may select signals received from one of the antennas 252 for processing. The signals received from multiple antennas 252 may be combined for enhanced receive diversity. The user terminal's transceiver front-end 254 also performs processing complementary to that performed by the access point's transceiver front-end 222 and provides a recovered downlink data symbol stream. An RX data processor 270 processes (e.g., demodulates, deinterleaves, and decodes) the recovered downlink data symbol stream to obtain decoded data for the user terminal.

Example RF Transceiver

Figure 3:
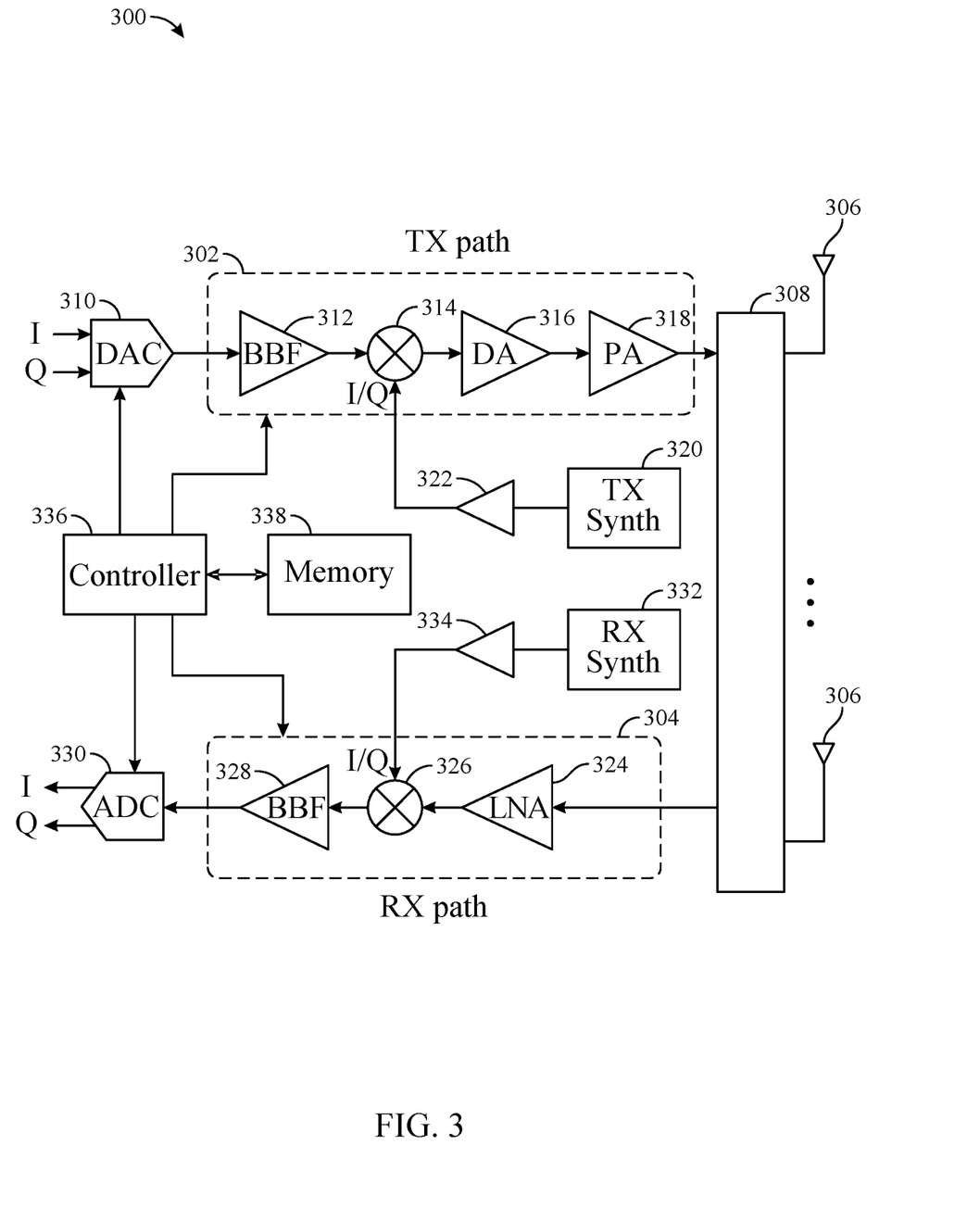
FIG. 3 is a block diagram of an example transceiver front-end, in which aspects of the present disclosure may be practiced.

FIG. 3 is a block diagram of an example transceiver front-end 300, such as the transceiver front-ends 222, 254 in FIG. 2, in which aspects of the present disclosure may be practiced. The transceiver front-end 300 includes at least one transmit (TX) path 302 (also known as a "transmit chain") for transmitting signals via one or more antennas 306 and at least one receive (RX) path 304 (also known as a "receive chain") for receiving signals via the antennas 306. When the TX path 302 and the RX path 304 share an antenna 306, the paths may be connected with the antenna via an interface 308, which may include any of various suitable RF devices, such as a switch, a duplexer, a diplexer, a multiplexer, and the like.

Receiving in-phase (I) and/or quadrature (Q) baseband analog signals from a digital-to-analog converter (DAC) 310, the TX path 302 may include a baseband filter (BBF) 312, a mixer 314, a driver amplifier (DA) 316, and a power amplifier (PA) 318. The BBF 312, the mixer 314, the DA 316, and the PA 318 may be included in a radio frequency integrated circuit (RFIC). For certain aspects, the PA 318 may be external to the RFIC.

For certain aspects, the DAC 310 may be implemented with adaptive switch biasing, as described in more detail below. The BBF 312 filters the baseband signals received from the DAC 310, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna 306.

The RX path 304 may include a low noise amplifier (LNA) 324, a mixer 326, and a baseband filter (BBF) 328. The LNA 324, the mixer 326, and the BBF 328 may be included in a RFIC, which may or may not be the same RFIC that includes the TX path components. RF signals received via the antenna 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 320, which may be buffered or amplified by amplifier 322 before being mixed with the baseband signals in the mixer 314. Similarly, the receive LO may be produced by an RX frequency synthesizer 332, which may be buffered or amplified by amplifier 334 before being mixed with the RF signals in the mixer 326. For certain aspects, a single frequency synthesizer may be used for both the TX path 302 and the RX path 304. In certain aspects, the TX frequency synthesizer 320 and/or RX frequency synthesizer 332 may include a frequency multiplier, such as a frequency doubler, that is driven by an oscillator (e.g., a VCO) in the frequency synthesizer.

A controller 336 (e.g., controller 280 in FIG. 2) may direct the operation of the transceiver front-end 300, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 282 in FIG. 2) may store data and/or program codes for operating the transceiver front-end 300. The controller 336 and/or the memory 338 may include control logic (e.g., complementary metal-oxide-semiconductor (CMOS) logic).

While FIGS. 1-3 provide a wireless communication as an example application in which certain aspects of the present disclosure may be implemented to facilitate understanding, certain aspects described herein may be used for digital-to-analog conversion in any of various other suitable systems (e.g., an audio system or other electronic system).

Example DAC with Adaptive Switch Biasing

Current-steering DACs are one example architecture for high performance digital-to-analog conversion in many wireless transmitters. Current-steering DACs offer versatility of design, high-speed operation, and high performance.

Figure 4:
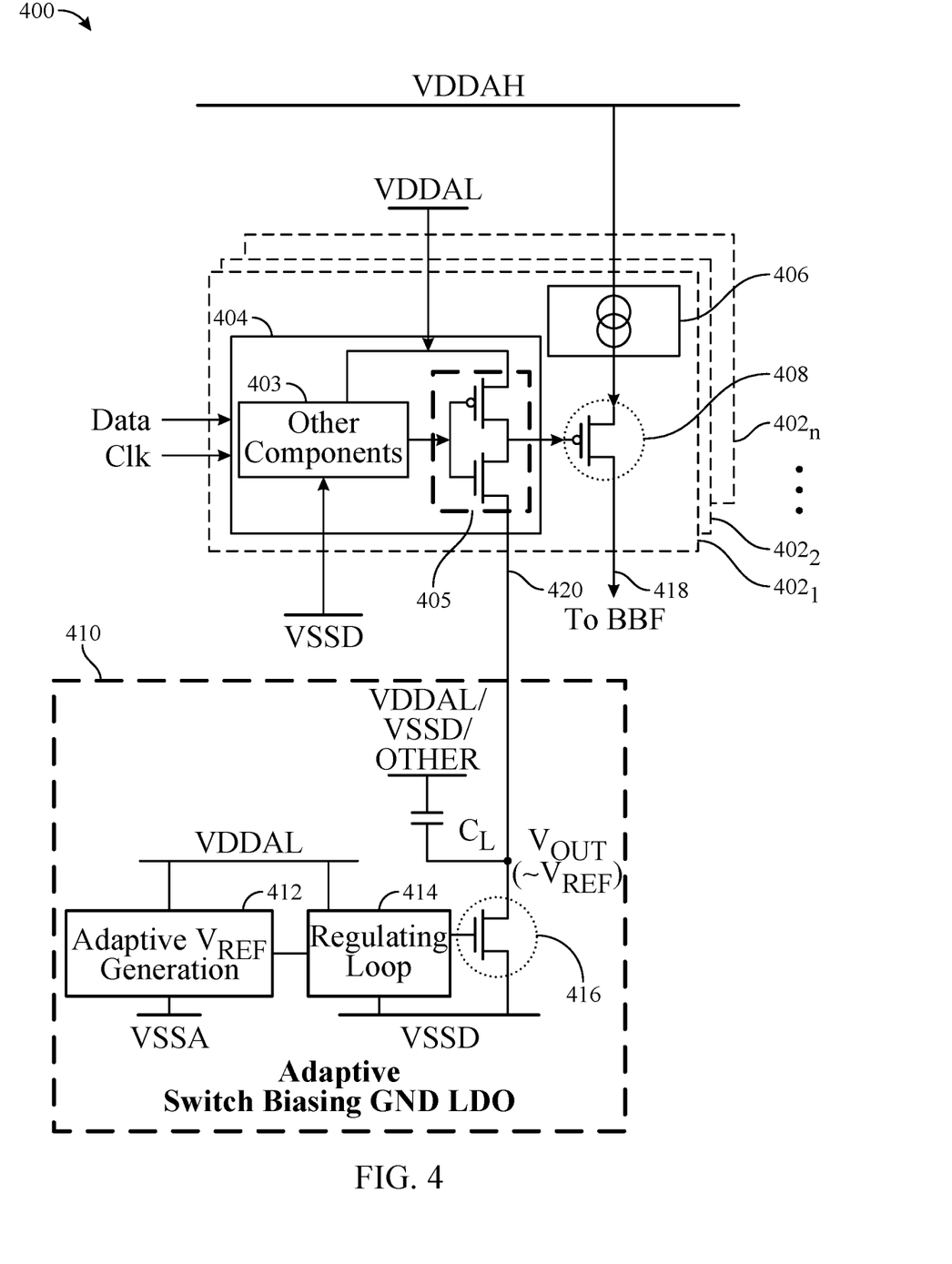
FIG. 4 is a block diagram of an example current-steering digital-to-analog converter (DAC) with adaptive switch biasing, in accordance with certain aspects of the present disclosure.

FIG. 4 illustrates an example current-steering DAC 400 (e.g., which may implement the DAC 310 of FIG. 3). The core of the DAC 400 includes a number n of current-steering cells 402₁ through 402n (collectively referred to as "current-steering cells 402"), where n is an integer greater than one. Each DAC cell 402 includes a switch driver 404, a current source 406, and at least one current-steering switch 408. The switch driver 404 may receive power from a first power supply rail (labeled "VDDAL"), whereas the current source 406 and the switch 408 may receive power from a second power supply rail (labeled "VDDAH"). The VDDAH power supply rail may have a higher voltage than the VDDAL power supply rail.

The current-steering switch 408 may be implemented by a transistor, such as a p-type metal-oxide-semiconductor (PMOS) transistor as illustrated in FIG. 4. The switch driver 404 may generally be used to improve the dynamic performance of the current-steering DAC 400. For example, the switch driver 404 can be used to reduce the signal feed-through, reduce current source node setting, reduce local and global timing errors, etc. The switch driver 404 may receive a digital input signal (labeled "Data") and a clock signal (labeled "Clk") and generate an output signal that drives the control input of the current-steering switch 408 (e.g., the gate of the PMOS transistor). Depending on the digital input signal, each bit of the DAC 400 associated with a current-steering DAC cell 402 may control that respective cell's switch 408 to source or block a current from the cell's current source to the DAC output 418. The sourced currents from the individual DAC cells 402 may be combined (e.g., using current summation) to provide the analog output signal at the DAC output 418. The DAC output 418 may be coupled to a baseband filter (e.g., the BBF 312 of FIG. 3) or any of various other suitable circuits.

Although the current-steering switch 408 is represented as a single-ended switch in FIG. 4, other implementations may use differential current-steering switches. Such differential current-steering switches may be driven by complementary switch driver signals.

As power supply voltages (e.g., VDDAH) are scaled down and bandwidth specifications increase in wireless devices, it becomes increasingly difficult for DACs to meet certain performance parameters, such as signal-to-noise ratio (SNR), distortion, and noise, with the reduced headroom (thus reduced output impedance (Zout)) for the DAC core current sources and switches. Greater input impedance of the DAC's load stage (e.g., a baseband filter) tends to make this situation even worse.

One solution involves lowering the load impedance (Zload) from the perspective of the DAC. To lower the DAC's load impedance, an impedance attenuation circuit may be employed at the output of the DAC. However, the impedance attenuation circuit may be hindered by reduced supply voltages and/or high power consumption (e.g. by an amplifier therein) to meet increased gain and/or bandwidth specifications. Another solution may use a ground low dropout voltage regulator (GND LDO) coupled to the switch drivers to isolate the ground noise and attenuate spurs at the DAC output. However, some GND LDO designs may not be able to meet certain advancing performance specifications and/or may cost significant power and/or area.

Certain aspects of the present disclosure provide techniques and circuitry for adaptively generating a reference voltage to bias one or more switch drivers of a current-steering DAC (e.g., bias the last stage 405 in each of the switch drivers 404, as opposed to other components 403 of each switch driver). As used herein, "adaptively generating a reference voltage" generally refers to generating the reference voltage to vary over time, as opposed to a nominally constant reference voltage. In one example, this adaptively generated reference voltage may track process, voltage, and temperature (PVT) changes in the DAC core, such as PVT of a DAC cell's current-steering switch 408. In this manner, the output of each switch driver 404 may be level-shifted (e.g., at the last stage 405) to adaptively bias the DAC cell's current-steering switch 408 to ensure this switch is fully saturated across PVT. The last stage 405 may be an inverter stage, such as a CMOS inverter stage as illustrated in FIG. 4. With adaptive switch biasing to track PVT of the DAC's core, desired SNR, distortion, and/or noise specifications may be achieved without calibration.

Therefore, the block diagram of FIG. 4 also illustrates an example implementation of an adaptive switch biasing scheme for use in the DAC 400, in accordance with certain aspects of the present disclosure. This implementation introduces adaptive switch biasing ground LDO circuitry 410 having an output coupled to a biasing node 420 of one or more switch drivers 404 (e.g., to the last stage 405 of a switch driver). The ground LDO circuitry 410 includes a pass transistor 416, an adaptive reference voltage ($V_{REF}$) generation circuit 412, a regulating loop 414, and a capacitive element (represented by capacitor $C_L$). The pass transistor 416 may be implemented by an n-type metal-oxide-semiconductor (NMOS) transistor, as shown. The source of the pass transistor 416 may be coupled to a reference potential node (e.g., electrical ground, and more particularly in certain aspects, a digital ground labeled "VS SD") for the DAC 400, and the drain of the pass transistor 416 may be coupled to the biasing node 420 and to the last stage 405 of one or more of the switch drivers 404. The capacitor $C_L$ may be coupled between the biasing node 420 and a power supply rail (e.g., VDDAL), a reference potential node (e.g., VSSD), or another low impedance node. In certain aspects, the adaptive $V_{REF}$ generation circuit 412 may be referenced to the same reference potential node as the regulating loop 414, while in other aspects, the adaptive $V_{REF}$ generation circuit 412 may be referenced to a different reference potential node (e.g., an analog ground labeled "VSSA," as shown in FIG. 4). The output of the adaptive $V_{REF}$ generation circuit 412 may be coupled to the input of the regulating loop 414, and the output of the regulating loop 414 may be coupled to the gate of the pass transistor 416. In certain aspects, digital ground VSSD and analog ground VSSA may be coupled together (e.g., using a single trace) and may have the same electric potential.

For certain aspects, the adaptive $V_{REF}$ generation circuit 412 may receive power from the first power supply rail (e.g., VDDAL), from the second power supply rail (e.g., VDDAH), or from both the first and second power supply rails. For certain aspects, the first and second power supply rails may have the same electric potential and, in some of these cases, may be the same power supply rail.

In addition to isolating the ground noise, the ground LDO circuitry 410 depicted in FIG. 4 adaptively generates $V_{REF}$ for the regulating loop 414 controlling the pass transistor 416 that biases the last stage of (each of) the switch drivers 404 in the DAC core. In certain aspects, just the last stage 405 in the switch driver(s) 404 may be shifted to further reduce load current and total power consumption. The ground LDO circuitry 410 may be simpler than some other ground LDO designs, and may have a much lower supply voltage and current and a much smaller area. The adaptive $V_{REF}$ generation circuit 412 is designed to track process, power supply voltage, and temperature (PVT) of the DAC core to generate the optimal, or at least a suitable, reference voltage for the GND LDO. Due to regulation by the regulating loop 414, the output voltage ($V_{OUT}$) of the ground LDO circuitry 410 may be maintained approximately equal to $V_{REF}$ as generated by the adaptive $V_{REF}$ generation circuit 412.

Figure 5A:
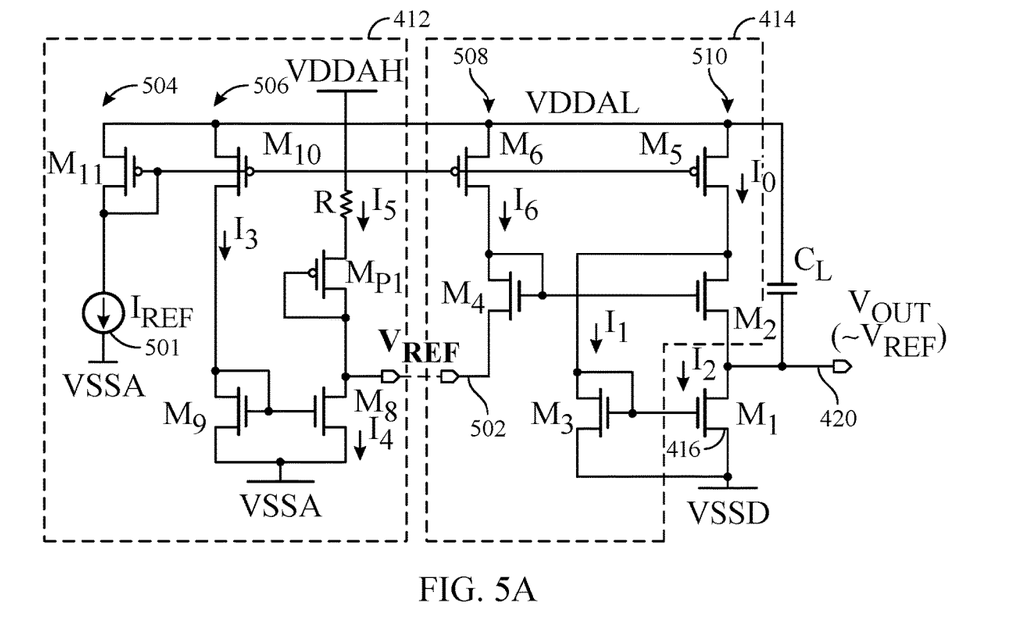
FIGS. 5A and 5B are schematic diagrams of example circuits for implementing adaptive switch biasing for a DAC, in accordance with certain aspects of the present disclosure.
Figure 5B:
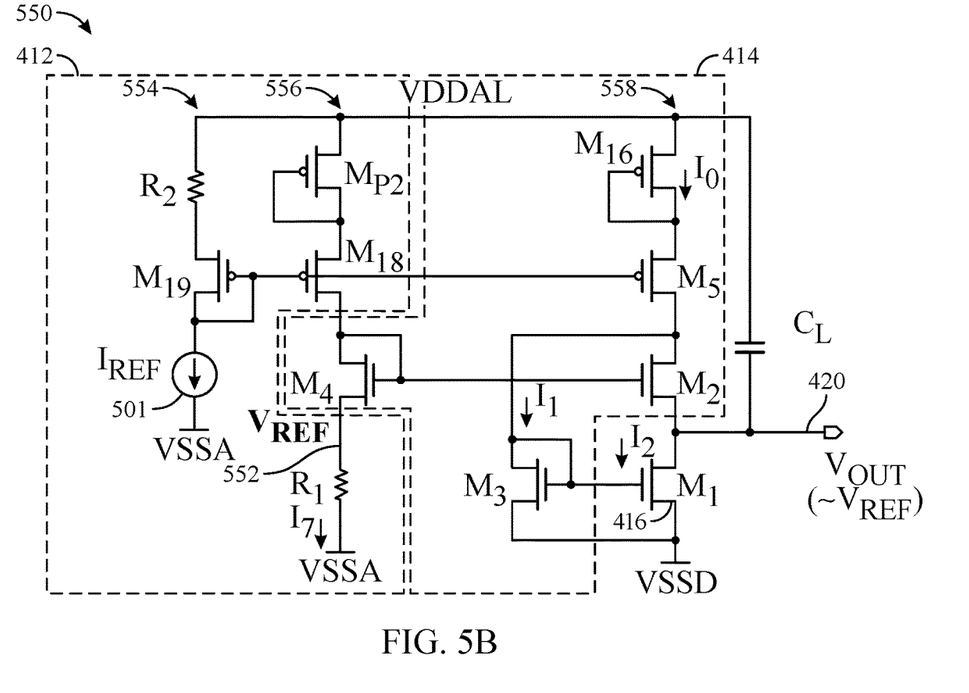

FIGS. 5A and 5B are schematic diagrams of example circuits 500, 550 for implementing the adaptive switch biasing ground LDO circuitry 410, in accordance with certain aspects of the present disclosure. In circuit 500 of FIG. 5A, for example, the adaptive $V_{REF}$ generation circuit 412 is implemented using transistors $M_{P1}$, $M_8$, $M_9$, $M_{10}$, and $M_{11}$, a reference current source 501 (e.g., a constant current source) with reference current $I_{REF}$, and resistor R. Transistors $M_8$ and $M_9$ may be n-type transistors, whereas transistors $M_{P1}$, $M_{10}$, and $M_{11}$ may be p-type transistors, as depicted. The regulating loop 414 in circuit 500 is implemented using transistors $M_2$, $M_3$, $M_4$, $M_5$, and $M_6$. Transistors $M_2$, $M_3$, and $M_4$ may be n-type transistors, whereas transistors $M_5$ and $M_6$ may be p-type transistors, as shown.

Transistor $M_2$ has a source coupled to a drain of pass transistor $M_1$ and to the biasing node 420 with an output voltage ($V_{OUT}$) for the ground LDO circuitry 410. Transistor $M_3$ has a gate coupled to a gate of the pass transistor $M_1$, to a drain of transistor $M_3$, and to a drain of transistor $M_2$. Transistor $M_3$ also has a source coupled to the reference potential node (e.g., electrical ground, such as VSSD) for the DAC. Transistor $M_4$ has a gate coupled to a gate of transistor $M_2$ and to a drain of transistor $M_4$. Transistor $M_4$ also has a source coupled to a $V_{REF}$ node 502 at which the reference voltage is generated by the adaptive $V_{REF}$ generation circuit 412. Transistor $M_5$ has a source coupled to the VDDAL power supply rail and has a drain coupled to the drain of transistor $M_2$ and to the drain and the gate of transistor $M_3$. Transistor $M_6$ has a source coupled to the VDDAL power supply rail and has a drain coupled to the drain and the gate of transistor $M_4$.

Transistor $M_{P1}$ has a gate coupled to a drain of transistor $M_{P1}$ and to the $V_{REF}$ node 502. A resistive element (e.g., resistor R) may be coupled between the VDDAH power supply rail and a source of transistor $M_{P1}$. This resistive element may replicate a degeneration resistor associated with the current source 406 in one of the DAC cells 402. For certain aspects, the resistance of this resistive element may be calibrated. Transistor $M_8$ has a drain coupled to the drain and the gate of transistor $M_{P1}$ and to the $V_{REF}$ node 502. Transistor $M_8$ may also have a source coupled to a reference potential node (e.g., VSSA) for the adaptive $V_{REF}$ generation circuit 412. Transistor $M_9$ has a gate coupled to a gate of transistor $M_8$ and to a drain of transistor $M_9$. Transistor $M_9$ may also have a source coupled to the same reference potential node (e.g., VSSA) as transistor $M_8$. Transistor $M_{10}$ has a drain coupled to the drain and the gate of transistor $M_9$ and to the gate of transistor $M_8$. Transistor $M_{10}$ also has a source coupled to the VDDAL power supply rail. Transistor $M_{11}$ has a source coupled to the VDDAL power supply rail and a drain coupled to a gate of transistor $M_{11}$, a gate of transistor $M_{10}$, a gate of transistor $M_6$, and a gate of transistor $M_5$. The current source 501 is coupled between the drain of transistor $M_{11}$ and the reference potential node (e.g., VSSA) for the adaptive $V_{REF}$ generation circuit 412.

In the alternative circuit 550 of FIG. 5B, for example, the adaptive $V_{REF}$ generation circuit 412 is implemented using transistors $M_{P2}$, $M_{18}$, and $M_{19}$, a reference current source 501 with reference current $I_{REF}$, and resistors $R_1$ and $R_2$. Transistors $M_{P2}$, $M_{18}$, and $M_{19}$ may be p-type transistors, as shown. The regulating loop 414 in circuit 550 is implemented using transistors $M_2$, $M_3$, $M_4$, $M_5$, and $M_{16}$. Transistors $M_2$, $M_3$, and $M_4$ may be n-type transistors, whereas transistors $M_5$ and $M_6$ may be p-type transistors, as illustrated.

Transistor $M_2$ has a source coupled to a drain of pass transistor $M_1$ and to the biasing node 420 for the ground LDO circuitry 410. Transistor $M_3$ has a gate coupled to a gate of the pass transistor $M_1$, to a drain of transistor $M_3$, and to a drain of transistor $M_2$. Transistor $M_3$ also has a source coupled to the reference potential node (e.g., digital ground VSSD) for the DAC. Transistor $M_4$ has a gate coupled to a gate of transistor $M_2$ and to a drain of transistor $M_4$. Transistor $M_4$ also has a source coupled to a $V_{REF}$ node 552 at which the reference voltage is generated by the adaptive $V_{REF}$ generation circuit 412. Transistor $M_5$ has a drain coupled to the drain of transistor $M_2$ and to the drain and the gate of transistor $M_3$. Transistor $M_{16}$ has a source coupled to the VDDAL power supply rail and has a gate coupled to a drain of transistor $M_{16}$ and to a source of transistor $M_5$.

A first resistive element (e.g., resistor $R_1$) may be coupled between the $V_{REF}$ node 552 and a reference potential node (e.g., analog ground VSSA) for the adaptive $V_{REF}$ generation circuit 412. Transistor $M_{P2}$ has a source coupled to the VDDAL power supply rail and has a gate coupled to a drain of transistor $M_{P2}$. Transistor $M_{18}$ has a source coupled to the drain and the gate of transistor $M_{P2}$ and has a drain coupled to the drain and the gate of transistor $M_4$ and to the gate of transistor $M_2$. Transistor $M_{19}$ has a drain coupled to a gate of transistor $M_{19}$, a gate of transistor $M_{18}$, and a gate of transistor $M_5$. A second resistive element (e.g., resistor $R_2$) may be coupled between the VDDAL power supply rail and a source of transistor $M_{19}$. The current source 501 is coupled between the drain of transistor $M_{19}$ and the reference potential node (e.g., VSSA) as the first resistive element.

In the regulating loop 414 of the circuits 500, 550, if $V_{OUT}$ initially increases, then the gate-to-source voltage of transistor $M_2$ ($V_{GS,M2}$) decreases, leading to reduced drain-to-source current $I_2$ through transistor $M_1$. Since the current $I_0$ through transistor $M_5$ should equal the sum of currents $I_1$ and $I_2$, the reduced current $I_2$ leads to an increased drain-to-source current $I_1$ through transistor $M_3$, which causes the gate-to-source voltage of transistor $M_1$ ($V_{GS,M1}$) to increase, thereby increasing current $I_2$ and decreasing $V_{OUT}$, counteracting the initial increase in $V_{OUT}$ and maintaining $V_{OUT}$ at a constant voltage. In contrast, if $V_{OUT}$ decreases initially, then the opposite reactions occur in the regulating loop 414. In particular, if $V_{OUT}$ initially decreases, then $V_{GS,M2}$ increases, leading to higher drain-to-source current $I_2$ through transistor $M_1$. Since the current $I_0$ should equal the sum of currents $I_1$ and $I_2$, the higher current $I_2$ leads to a reduced drain-to-source current $I_1$ through transistor $M_3$, which causes $V_{GS,M1}$ to decrease, thereby decreasing current $I_2$ and increasing $V_{OUT}$, counteracting the initial decrease in $V_{OUT}$.

To generate the reference voltage ($V_{REF}$), transistor $M_{P1}$ (or $M_{P2}$) may replicate the p-type metal-oxide-semiconductor (PMOS) transistor in the DAC's current switch 408, with the same size (e.g., width-to-length ratio (W/L)) and same threshold voltage ($V_{TH}$) for a given process and temperature (or at least exhibit characteristics similar to the PMOS transistor in the DAC's current switch. If the threshold voltage of transistor $M_{P1}$ or $M_{P2}$ increases (or decreases), $V_{REF}$ decreases (or increases).

During operation of circuit 500, the current source 501 sets the reference current $I_{REF}$ in a first branch 504 of a first current mirror circuit, also having a second branch 506, a third branch 508, and a fourth branch 510. For certain aspects, the reference current $I_{REF}$ may be equal to the current from the DAC core current source 406. The first current mirror circuit will set the source-to-drain current $I_3$ through transistor $M_{10}$ (in the second branch 506) based on the size ratio between transistors $M_{11}$ and $M_{10}$. A second current mirror circuit comprising transistors $M_9$ and $M_8$ will use the current $I_3$ as a reference current and set the drain-to-source current $I_4$ through transistor $M_8$ based on the size ratio between transistors $M_9$ and $M_8$. The first current mirror circuit will also set the source-to-drain current $I_6$ through transistor $M_6$ (in the third branch 508) based on the size ratio between transistors $M_{11}$ and $M_6$ and set the current $I_0$ through transistor $M_5$ (in the fourth branch 510) based on the size ratio between transistors $M_{11}$ and $M_5$. Transistor $M_5$ will also pull current $I_5$ from the VDDAH power supply rail such that the current $I_4$ equals the sum of currents $I_5$ and $I_6$ and the voltage drop from the VDDAH power supply rail across the resistor R and the source-to-drain voltage across transistor $M_{P1}$ with current $I_5$ sets $V_{REF}$ at node 502. In this manner, $V_{REF}$ tracks the $V_{TH}$ changes in transistor $M_{P1}$.

During operation of circuit 550, the current source 501 sets the reference current $I_{REF}$ in a first branch 554 of a current mirror circuit, also having a second branch 556 and a third branch 558. For certain aspects, the reference current $I_{REF}$ may be equal to the current from the DAC core current source 406. The current mirror circuit may set the source-to-drain current $I_7$ through transistor $M_{18}$ (in the second branch 556) based on the size ratio between transistors $M_{19}$ and $M_{18}$ and based on the voltage drop across resistor $R_2$ and transistor $M_{P2}$. The current mirror circuit will also set the current $I_0$ through transistor $M_5$ (in the third branch 558) based on the size ratio between transistors $M_{18}$ and $M_5$, which may equal the size ratio between transistors $M_{P2}$ and $M_{16}$, such that the current ratio between currents $I_7$ and $I_0$ is set by transistors $M_{18}$ and $M_5$, respectively. In this manner, $V_{REF}$ at node 552 equals the voltage drop across resistor $R_1$ with current $I_7$. Transistor $M_{P2}$ is diode-connected, such that the source-to-gate voltage of transistor $M_{P2}$ is approximately equal to the threshold voltage of transistor $M_{P2}$. When the threshold voltage of transistor $M_{P2}$ increases (e.g., due to a PVT change), the current $I_7$ will decrease, which results in a decrease in $V_{REF}$ at node 552. In contrast, when the threshold voltage of transistor $M_{P2}$ decreases, the current $I_7$ will increase, thereby resulting in an increase in $V_{REF}$. With the gates of transistors $M_2$ and $M_4$ and the drain of transistor $M_4$ being shorted together, the gate voltages of transistor $M_4$ and $M_2$ will follow the changes in the threshold voltage of transistor $M_{P2}$ with PVT. With the drain-to-source voltage equaling the gate-to-source voltage of transistor $M_4$ and transistors $M_2$ and $M_4$ being similar, the output voltage ($V_{OUT}$) will approximately equal and track $V_{REF}$ at node 552.

The circuit 500 or 550 may also be modified to track cascode transistors and/or current sources with resistor degeneration. For example, the resistor R in circuit 500 may replicate a resistor for degeneration in the DAC core current source 406, as described above.

For $V_{OUT}$ regulation by the circuit 500 or 550, no operational transconductance amplifier (OTA) may be utilized, and a compensation capacitor may not be included in the circuit. The adaptive switch biasing ground LDO circuitry (e.g., as implemented in the circuits 500, 550) may operate with higher bandwidth and consume lower power than some other LDOs and other solutions for DAC switch biasing.

Figure 6:
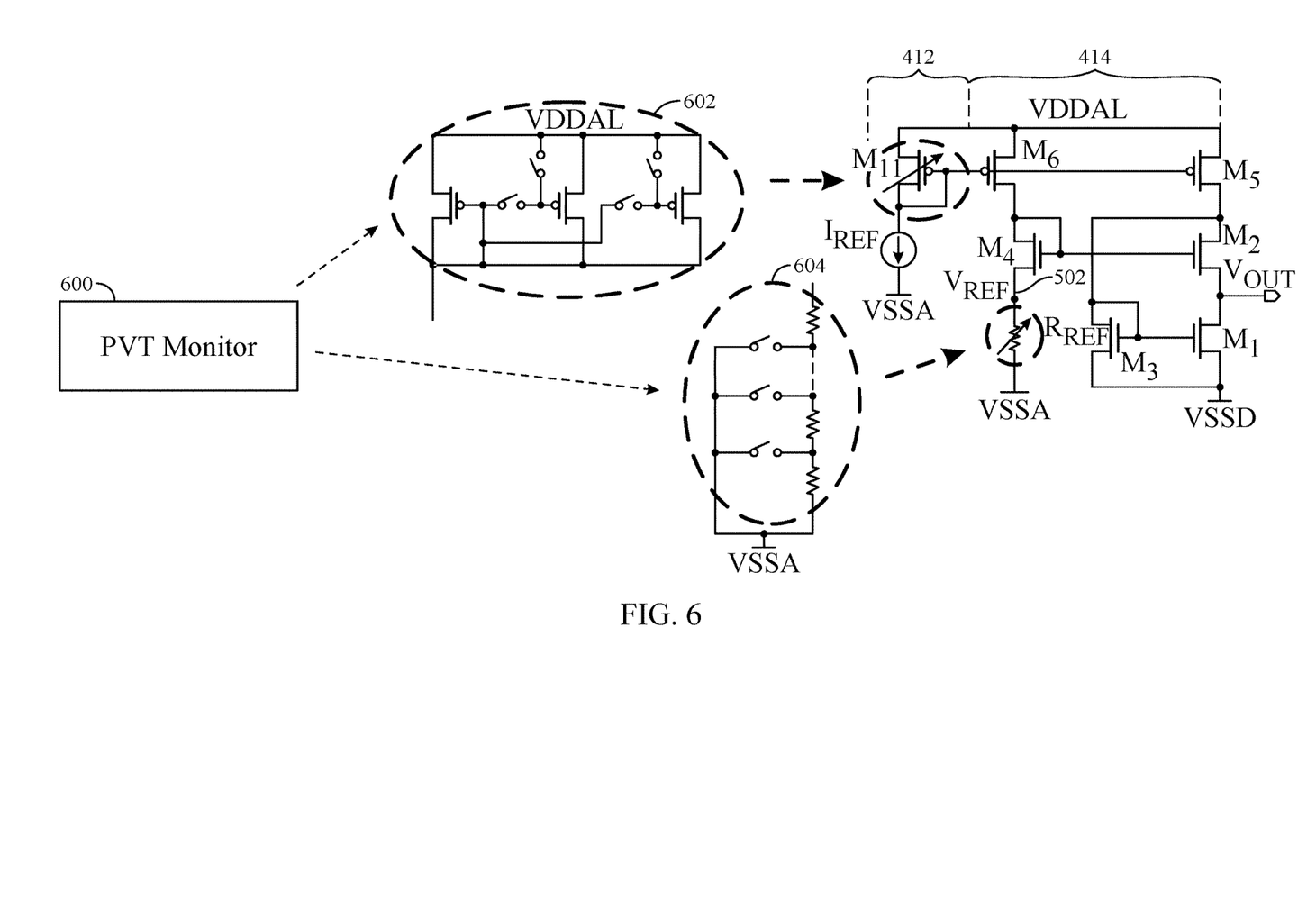
FIG. 6 illustrates alternative circuits for implementing adaptive reference voltage generation, in accordance with certain aspects of the present application.

FIG. 6 illustrates alternative circuits for implementing adaptive $V_{REF}$ generation using an external PVT monitor 600, in accordance with certain aspects of the present application. The external PVT monitor 600 may track the PVT of the DAC core switch (e.g., current-steering switch 408), such that a matching transistor (e.g., transistor $M_{P1}$ or $M_{P2}$) may not be used in generating $V_{REF}$. For certain aspects, the external PVT monitor 600 may generate $V_{REF}$ directly and supply $V_{REF}$ to the regulating loop 414 (e.g., at the $V_{REF}$ node 502). For other aspects, the external PVT monitor 600 may generate a reference current (e.g., $I_{REF}$) correlated to PVT of the DAC core switch, for use in the adaptive $V_{REF}$ generation circuit 412. For yet other aspects, the external PVT monitor 600 may tune or digitally configure the branch currents by adjusting the effective size of transistor $M_{11}$ (e.g., as in circuit 602, with an array of switches configured to selectively couple or decouple a plurality of transistors in parallel), and hence the transistor ratios in the different branches of the regulating loop 414. For yet other aspects, the external PVT monitor 600 may tune or digitally adjust the resistance of the reference resistor $R_{REF}$ (e.g., as in circuit 604, with an array of switches coupled to a common ground (such as analog ground VSSA) at one end and to a resistor ladder at the other). The external PVT monitor 600 may be implemented with other technologies sharing the same die.

Aspects of the present disclosure with adaptive switch biasing offer increased signal-to-noise-and-distortion ratio (SNDR) and lower distortion over operation corners compared to some other DAC switch biasing solutions. Aspects of the present disclosure may also offer reduced switching noise, smaller area, lower supply voltage, lower quiescent current, and/or lower peak load current compared to some other DAC switch biasing schemes.

Example Conversion Operations

Figure 7:
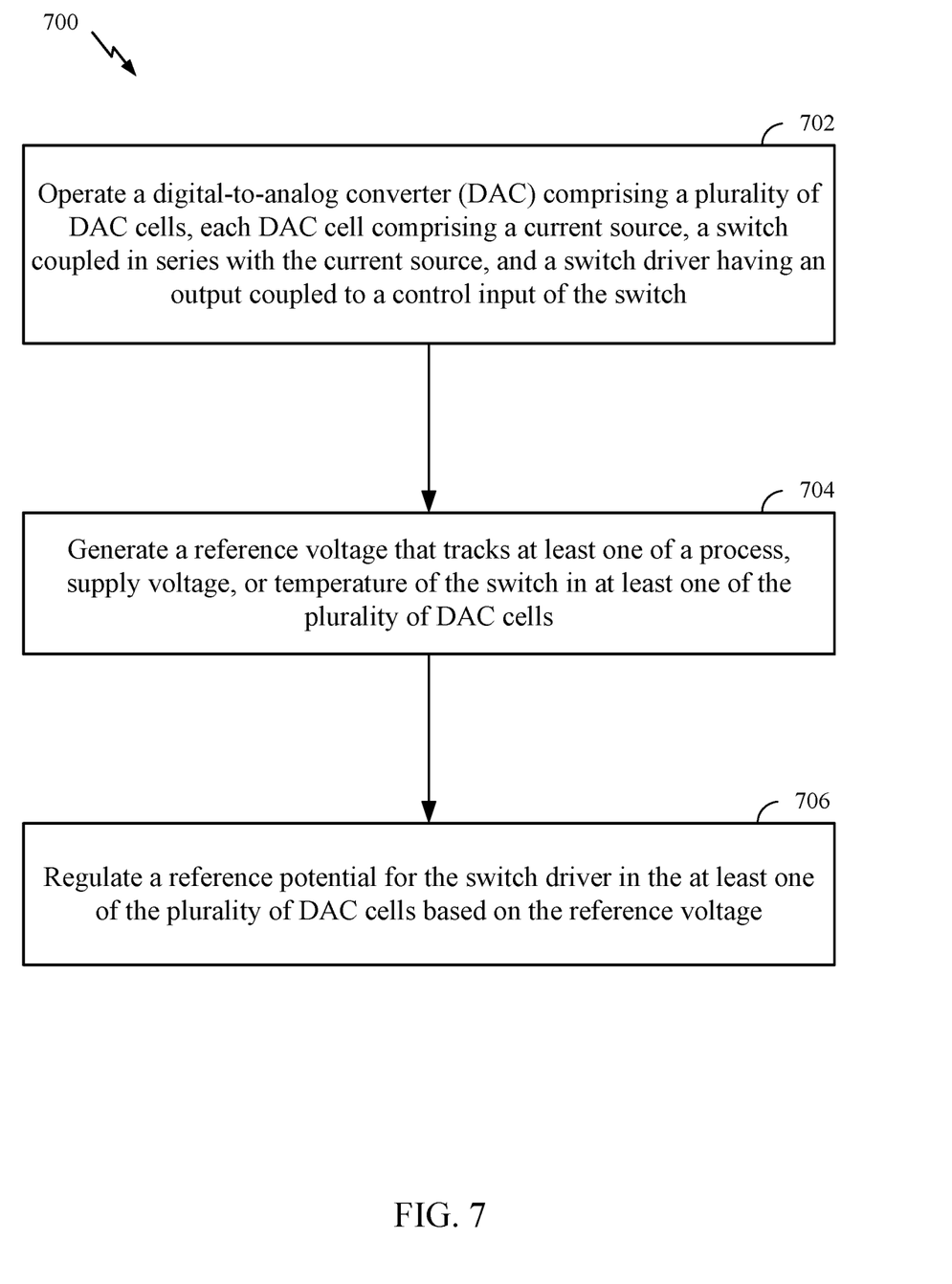
FIG. 7 is a flow diagram of example operations for digital-to-analog conversion, in accordance with certain aspects of the present disclosure.

FIG. 7 is a flow diagram of example operations 700 for digital-to-analog conversion, in accordance with certain aspects of the present disclosure. The operations 700 may be performed, for example, by a DAC supporting adaptive switch biasing (e.g., DAC 400 with ground LDO circuitry 410).

The operations 700 may begin, at block 702, by operating the DAC, which comprises a plurality of DAC cells (e.g., DAC cells 402). Each DAC cell may include a current source (e.g., current source 406), a switch (e.g., switch 408) coupled in series with the current source, and a switch driver (e.g., switch driver 404) having an output coupled to a control input of the switch. At block 704, the DAC may generate a reference voltage (e.g., $V_{REF}$) that tracks at least one of a process, supply voltage, or temperature (e.g., PVT) of the switch in at least one of the plurality of DAC cells. At block 706, the DAC may regulate a reference potential (e.g., $V_{OUT}$) for the switch driver in the at least one of the plurality of DAC cells based on the reference voltage.

According to certain aspects, the regulating at block 706 may include regulating the reference potential for a last stage (e.g., last stage 405) of the switch driver in the at least one of the plurality of DAC cells based on the reference voltage. For certain aspects, the regulating at block 706 may involve controlling a pass transistor (e.g., transistor $M_1$) coupled between the last stage of the switch driver and a reference potential node (e.g., electrical ground, such as VSSD) for the DAC, based on the reference voltage.

According to certain aspects, the generating at block 704 may include inversely adjusting the reference voltage based on a threshold voltage of a diode-connected transistor (e.g., transistor $M_{P1}$ or $M_{P2}$). In this case, the diode-connected transistor may be a same transistor type with similar dimensions as the switch in the at least one of the plurality of DAC cells.

According to certain aspects, the generating at block 704 may involve mirroring a reference current (e.g., $I_{REF}$) from a first branch (e.g., first branch 554) of a current mirror circuit in a second branch (e.g., second branch 556) of the current mirror circuit. The second branch of the current mirror circuit may include a resistive element (e.g., resistor $R_1$) and a diode-connected transistor (e.g., transistor $M_{P2}$). The diode-connected transistor may be a same transistor type with similar dimensions as the switch in the at least one of the plurality of DAC cells. In this case, the reference voltage may equal a voltage drop of the mirrored current (e.g., current $I_7$) across the resistive element. For certain aspects, the regulating at block 706 may involve mirroring the reference current from the first branch of the current mirror circuit in a third branch (e.g., third branch 558) of the current mirror circuit.

According to certain aspects, the operations 700 may further include monitoring the at least one of the process, supply voltage, or temperature of the switch in the at least one of the plurality of DAC cells. For example, the monitoring may be performed by an external PVT monitor (e.g., PVT monitor 600). In this case, the generating at block 706 may involve generating the reference voltage based on the monitored process, supply voltage, or temperature of the switch. For example, the DAC may generate the reference voltage by: (1) tuning a transistor size (e.g., of transistor $M_{11}$) in a first branch of a current mirror circuit based on the monitored process, supply voltage, or temperature of the switch in the at least one of the plurality of DAC cells; or (2) tuning a resistance of a reference resistive element (e.g., resistor $R_{REF}$) in a second branch of the current mirror circuit based on the monitored process, supply voltage, or temperature of the switch in the at least one of the plurality of DAC cells.

Example Aspects

In addition to the various aspects described above, specific combinations of aspects are within the scope of the present disclosure, some of which are detailed below:

Aspect 1: A digital-to-analog converter (DAC) comprising: a plurality of DAC cells, each DAC cell comprising a current source, a switch coupled in series with the current source, and a switch driver coupled to a control input of the switch, the switch driver being configured to receive power from a first power supply rail referenced to a first reference potential node; a regulation circuit comprising a first transistor coupled between the first reference potential node and the switch driver in at least one of the plurality of DAC cells; and a reference voltage generation circuit coupled to the regulation circuit and configured to adaptively generate a reference voltage for the regulation circuit.

Aspect 2: The DAC of Aspect 1, wherein the first transistor is coupled between the first reference potential node and a last stage of the switch driver in the at least one of the plurality of DAC cells.

Aspect 3: The DAC of Aspect 1 or 2, wherein the switch driver comprises a complementary metal-oxide-semiconductor (CMOS) inverter and wherein the first transistor is coupled between the first reference potential node and a source of an n-type metal-oxide-semiconductor (NMOS) transistor in the CMOS inverter.

Aspect 4: The DAC of any preceding Aspect, wherein the reference voltage generation circuit is configured to adaptively generate the reference voltage by, at least in part, tracking at least one of a process, supply voltage, or temperature of the switch in the at least one of the plurality of DAC cells.

Aspect 5: The DAC of Aspect 4, wherein: the reference voltage generation circuit comprises a diode-connected transistor; the diode-connected transistor is a same transistor type with similar dimensions as the switch in the at least one of the plurality of DAC cells; and the reference voltage generation circuit is configured to adaptively generate the reference voltage by, at least in part, inversely adjusting the reference voltage based on a threshold voltage of the diode-connected transistor.

Aspect 6: The DAC of any of Aspects 1-4, wherein the regulation circuit further comprises: a second transistor having a source coupled to a drain of the first transistor, wherein a source of the first transistor is coupled to the first reference potential node and wherein the drain of the first transistor is coupled to the switch driver of the at least one of the plurality of DAC cells; a third transistor having a gate coupled to a gate of the first transistor, to a drain of the third transistor, and to a drain of the second transistor and having a source coupled to the first reference potential node; and a fourth transistor having a gate coupled to a gate of the second transistor and to a drain of the fourth transistor and having a source coupled to a reference voltage node.

Aspect 7: The DAC of Aspect 6, wherein the regulation circuit further comprises: a fifth transistor having a source coupled to the first power supply rail and having a drain coupled to the drain of the second transistor and to the drain and the gate of the third transistor; and a sixth transistor having a source coupled to the first power supply rail and having a drain coupled to the drain and the gate of the fourth transistor.

Aspect 8: The DAC of Aspect 7, wherein the reference voltage generation circuit comprises: a seventh transistor having a gate coupled to a drain of the seventh transistor and to the reference voltage node; a resistive element coupled between a second power supply rail and a source of the seventh transistor, the second power supply rail being configured to have a higher voltage than the first power supply rail; and an eighth transistor having a drain coupled to the drain and the gate of the seventh transistor and to the reference voltage node and having a source coupled to a second reference potential node.

Aspect 9: The DAC of Aspect 8, wherein the current source in the at least one of the plurality of DAC cells is coupled to the second power supply rail and wherein the seventh transistor is a same transistor type with similar dimensions as the switch in the at least one of the plurality of DAC cells.

Aspect 10: The DAC of Aspect 8 or 9, wherein the resistive element is configured to replicate a degeneration resistor associated with the current source in one of the plurality of DAC cells.

Aspect 11: The DAC of any of Aspects 8-10, wherein the reference voltage generation circuit further comprises: a ninth transistor having a gate coupled to a gate of the eighth transistor and to a drain of the ninth transistor and having a source coupled to the second reference potential node; a tenth transistor having a drain coupled to the drain and the gate of the ninth transistor and to the gate of the eighth transistor and having a source coupled to the first power supply rail; an eleventh transistor having a source coupled to the first power supply rail and a drain coupled to a gate of the eleventh transistor, a gate of the tenth transistor, a gate of the sixth transistor, and a gate of the fifth transistor; and a reference current source coupled between the drain of the eleventh transistor and the second reference potential node.

Aspect 12: The DAC of Aspect 11, wherein the eighth and ninth transistors are n-type transistors and wherein the seventh, tenth, and eleventh transistors are p-type transistors.

Aspect 13: The DAC of any of Aspects 7-12, wherein the first, second, third, and fourth transistors are n-type transistors and wherein the fifth and sixth transistors are p-type transistors.

Aspect 14: The DAC of any of Aspects 8-13, wherein the first reference potential node is electrically shorted to the second reference potential node.

Aspect 15: The DAC of Aspect 6, wherein the regulation circuit further comprises: a fifth transistor having a drain coupled to the drain of the second transistor and to the drain and the gate of the third transistor; and a sixth transistor having a source coupled to the first power supply rail and having a gate coupled to a drain of the sixth transistor and to a source of the fifth transistor.

Aspect 16: The DAC of Aspect 15, wherein the reference voltage generation circuit comprises a first resistive element coupled between the reference voltage node and a second reference potential node.

Aspect 17: The DAC of Aspect 16, wherein the reference voltage generation circuit further comprises: a seventh transistor having a source coupled to the first power supply rail and having a gate coupled to a drain of the seventh transistor; an eighth transistor having a source coupled to the drain and the gate of the seventh transistor and having a drain coupled to the drain and the gate of the fourth transistor and to the gate of the second transistor; a ninth transistor having a drain coupled to a gate of the ninth transistor, a gate of the eighth transistor, and a gate of the fifth transistor; a second resistive element coupled between the first power supply rail and a source of the ninth transistor; and a reference current source coupled between the drain of the ninth transistor and the second reference potential node.

Aspect 18: The DAC of Aspect 17, wherein the seventh, eighth, and ninth transistors are p-type transistors.

Aspect 19: The DAC of Aspect 17 or 18, wherein the seventh transistor is a same transistor type with similar dimensions as the switch in the at least one of the plurality of DAC cells.

Aspect 20: The DAC of any of Aspects 15-19, wherein the first, second, third, and fourth transistors are n-type transistors and wherein the fifth and sixth transistors are p-type transistors.

Aspect 21: The DAC of any of Aspects 6-20, further comprising a capacitive element coupled between: the first power supply rail and the drain of the first transistor; or the first reference potential node and the drain of the first transistor.

Aspect 22: The DAC of any preceding Aspect, wherein the first transistor is coupled between the first reference potential node and a last stage of the switch driver in each of the plurality of DAC cells.

Aspect 23: A wireless device comprising the DAC of any preceding Aspect, the wireless device further comprising: an antenna; and a transmit chain coupled between an output of the DAC and the antenna.

Aspect 24: A method of digital-to-analog conversion, comprising: operating a DAC comprising a plurality of DAC cells, each DAC cell comprising a current source, a switch coupled in series with the current source, and a switch driver having an output coupled to a control input of the switch; generating a reference voltage that tracks at least one of a process, supply voltage, or temperature of the switch in at least one of the plurality of DAC cells; and regulating a reference potential for the switch driver in the at least one of the plurality of DAC cells based on the reference voltage.

Aspect 25: The method of Aspect 24, wherein the regulating comprises regulating the reference potential for a last stage of the switch driver in the at least one of the plurality of DAC cells.

Aspect 26: The method of Aspect 25, wherein the regulating further comprises controlling a pass transistor coupled between the last stage of the switch driver and a reference potential node for the DAC, based on the reference voltage.

Aspect 27: The method of Aspect 24 or 25, wherein the generating comprises inversely adjusting the reference voltage based on a threshold voltage of a diode-connected transistor, the diode-connected transistor being a same transistor type with similar dimensions as the switch in the at least one of the plurality of DAC cells.

Aspect 28: The method of any of Aspects 24-26, wherein: the generating comprises mirroring a reference current from a first branch of a current mirror circuit in a second branch of the current mirror circuit; the second branch of the current mirror circuit comprises a resistive element and a diode-connected transistor; the diode-connected transistor is a same transistor type with similar dimensions as the switch in the at least one of the plurality of DAC cells; and the reference voltage equals a voltage drop of the mirrored current across the resistive element.

Aspect 29: The method of Aspect 28, wherein the regulating comprises mirroring the reference current from the first branch of the current mirror circuit in a third branch of the current mirror circuit.

Aspect 30: The method of any of Aspects 24-26, further comprising monitoring the at least one of the process, supply voltage, or temperature of the switch in the at least one of the plurality of DAC cells, wherein the generating comprises generating the reference voltage based on the monitored process, supply voltage, or temperature of the switch.

Aspect 31: The method of Aspect 30, wherein generating the reference voltage comprises: tuning a transistor size in a first branch of a current mirror circuit based on the monitored process, supply voltage, or temperature of the switch in the at least one of the plurality of DAC cells; or tuning a resistance of a reference resistive element in a second branch of the current mirror circuit based on the monitored process, supply voltage, or temperature of the switch in the at least one of the plurality of DAC cells.

Aspect 32: An apparatus for digital-to-analog conversion, comprising: a plurality of DAC cells, each DAC cell comprising a current source, a switch coupled in series with the current source, and means for controlling the switch; means for generating a reference voltage that tracks at least one of a process, supply voltage, or temperature of the switch in at least one of the plurality of DAC cells; and means for regulating a reference potential for the means for controlling based on the reference voltage.

Conclusion

Described herein is a DAC circuit design to address the reduced headroom of core current sources along with increasing input impedance of the DAC's load stage. Certain aspects of the present disclosure provide improved ground LDO circuitry for a current-steering DAC that shifts the last (inverter) stage of the switch drivers. To generate the shift for the last stage, the ground LDO circuitry adaptively generates $V_{REF}$ by tracking the PVT of the DAC core.

The above description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components. For example, means for controlling a switch may comprise a switch driver, such as the switch driver 404 of FIG. 4. Means for generating a reference voltage may comprise a reference voltage generation circuit, such as the adaptive $V_{REF}$ generation circuit 412 of FIG. 4, 5A, 5B, or 6. Means for regulating a reference potential may include a regulating circuit, such as the regulating loop 414 of FIG. 4, 5A, 5B, or 6.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. A digital-to-analog converter (DAC) comprising:
   a plurality of DAC cells, each DAC cell comprising a current source, a switch coupled in series with the current source, and a switch driver coupled to a control input of the switch, the switch driver being configured to receive power from a first power supply rail referenced to a first reference potential node;
   a regulation circuit comprising a first transistor coupled between the first reference potential node and the switch driver in at least one of the plurality of DAC cells; and
   a reference voltage generation circuit coupled to the regulation circuit and configured to adaptively generate a reference voltage for the regulation circuit.

2. The DAC of claim 1, wherein the first transistor is coupled between the first reference potential node and a last stage of the switch driver in the at least one of the plurality of DAC cells.

3. The DAC of claim 1, wherein the switch driver comprises a complementary metal-oxide-semiconductor (CMOS) inverter and wherein the first transistor is coupled between the first reference potential node and a source of an n-type metal-oxide-semiconductor (NMOS) transistor in the CMOS inverter.

4. The DAC of claim 1, wherein the reference voltage generation circuit is configured to adaptively generate the reference voltage by, at least in part, tracking at least one of a process, supply voltage, or temperature of the switch in the at least one of the plurality of DAC cells.

5. The DAC of claim 4, wherein:
   the reference voltage generation circuit comprises a diode-connected transistor;
   the diode-connected transistor is a same transistor type with similar dimensions as the switch in the at least one of the plurality of DAC cells; and
   the reference voltage generation circuit is configured to adaptively generate the reference voltage by, at least in part, inversely adjusting the reference voltage based on a threshold voltage of the diode-connected transistor.

6. The DAC of claim 1, wherein the regulation circuit further comprises:
   a second transistor having a source coupled to a drain of the first transistor, wherein a source of the first transistor is coupled to the first reference potential node and wherein the drain of the first transistor is coupled to the switch driver of the at least one of the plurality of DAC cells;
   a third transistor having a gate coupled to a gate of the first transistor, to a drain of the third transistor, and to a drain of the second transistor and having a source coupled to the first reference potential node; and
   a fourth transistor having a gate coupled to a gate of the second transistor and to a drain of the fourth transistor and having a source coupled to a reference voltage node.

7. The DAC of claim 6, wherein the regulation circuit further comprises:
   a fifth transistor having a source coupled to the first power supply rail and having a drain coupled to the drain of the second transistor and to the drain and the gate of the third transistor; and
   a sixth transistor having a source coupled to the first power supply rail and having a drain coupled to the drain and the gate of the fourth transistor.

8. The DAC of claim 7, wherein the first, second, third, and fourth transistors are n-type transistors and wherein the fifth and sixth transistors are p-type transistors.

9. The DAC of claim 7, wherein the reference voltage generation circuit comprises:
   a seventh transistor having a gate coupled to a drain of the seventh transistor and to the reference voltage node;
   a resistive element coupled between a second power supply rail and a source of the seventh transistor, the second power supply rail being configured to have a higher voltage than the first power supply rail; and
   an eighth transistor having a drain coupled to the drain and the gate of the seventh transistor and to the reference voltage node and having a source coupled to a second reference potential node.

10. The DAC of claim 9, wherein the current source in the at least one of the plurality of DAC cells is coupled to the second power supply rail and wherein the seventh transistor is a same transistor type with similar dimensions as the switch in the at least one of the plurality of DAC cells.

11. The DAC of claim 9, wherein the resistive element is configured to replicate a degeneration resistor associated with the current source in one of the plurality of DAC cells.

12. The DAC of claim 9, wherein the reference voltage generation circuit further comprises:
   a ninth transistor having a gate coupled to a gate of the eighth transistor and to a drain of the ninth transistor and having a source coupled to the second reference potential node;
   a tenth transistor having a drain coupled to the drain and the gate of the ninth transistor and to the gate of the eighth transistor and having a source coupled to the first power supply rail;
   an eleventh transistor having a source coupled to the first power supply rail and a drain coupled to a gate of the eleventh transistor, a gate of the tenth transistor, a gate of the sixth transistor, and a gate of the fifth transistor; and a reference current source coupled between the drain of the eleventh transistor and the second reference potential node.

13. The DAC of claim 12, wherein the eighth and ninth transistors are n-type transistors and wherein the seventh, tenth, and eleventh transistors are p-type transistors.

14. The DAC of claim 9, wherein the first reference potential node is electrically shorted to the second reference potential node.

15. The DAC of claim 6, wherein the regulation circuit further comprises:

a fifth transistor having a drain coupled to the drain of the second transistor and to the drain and the gate of the third transistor; and a sixth transistor having a source coupled to the first power supply rail and having a gate coupled to a drain of the sixth transistor and to a source of the fifth transistor.

16. The DAC of claim 15, wherein the first, second, third, and fourth transistors are n-type transistors and wherein the fifth and sixth transistors are p-type transistors.

17. The DAC of claim 15, wherein the reference voltage generation circuit comprises a first resistive element coupled between the reference voltage node and a second reference potential node.

18. The DAC of claim 17, wherein the reference voltage generation circuit further comprises:

a seventh transistor having a source coupled to the first power supply rail and having a gate coupled to a drain of the seventh transistor;

an eighth transistor having a source coupled to the drain and the gate of the seventh transistor and having a drain coupled to the drain and the gate of the fourth transistor and to the gate of the second transistor;

a ninth transistor having a drain coupled to a gate of the ninth transistor, a gate of the eighth transistor, and a gate of the fifth transistor;

a second resistive element coupled between the first power supply rail and a source of the ninth transistor; and a reference current source coupled between the drain of the ninth transistor and the second reference potential node.

19. The DAC of claim 18, wherein the seventh, eighth, and ninth transistors are p-type transistors.

20. The DAC of claim 18, wherein the seventh transistor is a same transistor type with similar dimensions as the switch in the at least one of the plurality of DAC cells.

21. The DAC of claim 6, further comprising a capacitive element coupled between:

the first power supply rail and the drain of the first transistor.

22. The DAC of claim 1, wherein the first transistor is coupled between the first reference potential node and a last stage of the switch driver in each of the plurality of DAC cells.

23. A wireless device comprising the DAC of claim 1, the wireless device further comprising:

an antenna; and a transmit chain coupled between an output of the DAC and the antenna.

24. A method of digital-to-analog conversion, comprising:

operating a digital-to-analog converter (DAC) comprising a plurality of DAC cells, each DAC cell comprising a current source, a switch coupled in series with the current source, and a switch driver having an output coupled to a control input of the switch;

generating a reference voltage that tracks at least one of a process, supply voltage, or temperature of the switch in at least one of the plurality of DAC cells; and regulating a reference potential for the switch driver in the at least one of the plurality of DAC cells based on the reference voltage.

25. The method of claim 24, wherein the regulating comprises:

regulating the reference potential for a last stage of the switch driver in the at least one of the plurality of DAC cells based on the reference voltage; and controlling a pass transistor coupled between the last stage of the switch driver and a reference potential node for the DAC, based on the reference voltage.

26. The method of claim 24, wherein the generating comprises inversely adjusting the reference voltage based on a threshold voltage of a diode-connected transistor, the diode-connected transistor being a same transistor type with similar dimensions as the switch in the at least one of the plurality of DAC cells.

27. The method of claim 24, wherein:

the generating comprises mirroring a reference current from a first branch of a current mirror circuit in a second branch of the current mirror circuit;

the second branch of the current mirror circuit comprises a resistive element and a diode-connected transistor;

the diode-connected transistor is a same transistor type with similar dimensions as the switch in the at least one of the plurality of DAC cells;

the reference voltage equals a voltage drop of the mirrored current across the resistive element; and the regulating comprises mirroring the reference current from the first branch of the current mirror circuit in a third branch of the current mirror circuit.

28. The method of claim 24, further comprising monitoring the at least one of the process, supply voltage, or temperature of the switch in the at least one of the plurality of DAC cells, wherein the generating comprises generating the reference voltage based on the monitored process, supply voltage, or temperature of the switch.

29. The method of claim 28, wherein generating the reference voltage comprises:

tuning a transistor size in a first branch of a current mirror circuit based on the monitored process, supply voltage, or temperature of the switch in the at least one of the plurality of DAC cells; or tuning a resistance of a reference resistive element in a second branch of the current mirror circuit based on the monitored process, supply voltage, or temperature of the switch in the at least one of the plurality of DAC cells.

30. An apparatus for digital-to-analog conversion, comprising:

a plurality of digital-to-analog (DAC) cells, each DAC cell comprising a current source, a switch coupled in series with the current source, and means for controlling the switch;

means for generating a reference voltage that tracks at least one of a process, supply voltage, or temperature of the switch in at least one of the plurality of DAC cells; and means for regulating a reference potential for the means for controlling based on the reference voltage.

* * * * *